(12) United States Patent
Wu et al.

(10) Patent No.: US 12,708,054 B2
(45) Date of Patent: Aug. 11, 2026

(54) COMPOSITE SUBSTRATE AND METHOD FOR MANUFACTURING THE SAME, ELECTRONIC DEVICE

(71) Applicants: Beijing BOE Optoelectronics Technology Co., Ltd., Beijing (CN); BOE Technology Group Co., Ltd., Beijing (CN)

(72) Inventors: Yifan Wu, Beijing (CN); Yue Li, Beijing (CN); Yuelei Xiao, Beijing (CN); Xiaodong Li, Beijing (CN); Jingshu Zhang, Beijing (CN); Kidong Han, Beijing (CN); Yulin Feng, Beijing (CN); Qichang An, Beijing (CN); Yingwei Liu, Beijing (CN); Zijian Wang, Beijing (CN); Rui Ma, Beijing (CN); Quanyue Li, Beijing (CN); Song Chen, Beijing (CN); Qianyu Guo, Beijing (CN); Biqi Li, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 410 days.

(21) Appl. No.: 18/276,476

(22) PCT Filed: Jul. 14, 2022

(86) PCT No.: PCT/CN2022/105668

§ 371 (c)(1),
(2) Date: Aug. 9, 2023

(87) PCT Pub. No.: WO2024/011489

PCT Pub. Date: Jan. 18, 2024

(65) Prior Publication Data

US 2025/0006615 A1 Jan. 2, 2025

(51) Int. Cl.
*H10W 90/00* (2026.01)
*H05K 1/181* (2026.01)
(Continued)

(52) U.S. Cl.
CPC ......... *H10W 90/401* (2026.01); *H10W 70/05* (2026.01); *H10W 70/65* (2026.01);
(Continued)

(58) Field of Classification Search
None
See application file for complete search history.

(56) References Cited

U.S. PATENT DOCUMENTS 5,148,260 A 9/1992 Inoue et al.
11,101,214 B2 * 8/2021 Tsai ........................ H10P 72/74
(Continued)

FOREIGN PATENT DOCUMENTS

CN 106653703 A 5/2017
CN 108598061 B 9/2020
(Continued)

*Primary Examiner* — Timothy J Thompson
*Assistant Examiner* — John B Freal
(74) *Attorney, Agent, or Firm* — Nath, Goldberg & Meyer; Joshua B. Goldberg

(57) ABSTRACT

A composite substrate, a method for manufacturing a composite substrate, and an electronic device are provided. The composite substrate includes a package substrate and an interposer which are stacked; the interposer includes: a first dielectric substrate including a first connection via penetrating therethrough, and a first surface and a second surface opposite to each other; a first connection electrode in the first connection via; and a first connection structure and a second connection structure respectively on the first surface and the second surface and both connected to the first connection electrode; the package substrate includes: a second dielectric substrate on a side of the second connection structure away
(Continued)

from the first dielectric substrate; a third connection structure and a fourth connection structure which are on the second dielectric substrate and electrically connected; the third connection structure being electrically connected to the first connection electrode through the second connection structure.

14 Claims, 8 Drawing Sheets

(51) Int. Cl.

| | |
|---|---|
| ***H10W 70/05*** | (2026.01) |
| ***H10W 70/60*** | (2026.01) |
| ***H10W 70/65*** | (2026.01) |
| ***H10W 70/685*** | (2026.01) |
| ***H10W 70/692*** | (2026.01) |

(52) U.S. Cl.

CPC ....... *H10W 70/685* (2026.01); *H10W 70/692* (2026.01); *H10W 90/701* (2026.01); *H05K 1/181* (2013.01); *H05K 2201/10378* (2013.01); *H10W 70/60* (2026.01); *H10W 90/724* (2026.01)

(56) References Cited

U.S. PATENT DOCUMENTS

| | | | | |
|---|---|---|---|---|
| 11,171,090 | B2 * | 11/2021 | Wu | H10W 20/435 |
| 11,251,119 | B2 * | 2/2022 | Yu | H10P 72/74 |
| 11,302,600 | B2 * | 4/2022 | Hung | H10W 40/22 |
| 11,355,454 | B2 * | 6/2022 | Tsai | H10W 42/121 |
| 11,355,463 | B2 * | 6/2022 | Wu | H10W 70/09 |
| 11,532,582 | B2 * | 12/2022 | Wu | H10P 72/74 |
| 11,569,156 | B2 * | 1/2023 | Huang | H10W 42/121 |
| 2004/0036181 | A1 | 2/2004 | Hedler et al. | |
| 2009/0140415 | A1 | 6/2009 | Furuta | |
| 2013/0182402 | A1 | 7/2013 | Chen et al. | |
| 2015/0348955 | A1 | 12/2015 | Wu | |
| 2020/0173956 | A1 | 6/2020 | Bellman et al. | |
| 2022/0068862 | A1 * | 3/2022 | Wu | H10P 72/74 |
| 2022/0157732 | A1 * | 5/2022 | Tsai | H10W 70/614 |
| 2022/0361342 | A1 * | 11/2022 | Miki | H05K 3/3436 |

FOREIGN PATENT DOCUMENTS

| | | | |
|---|---|---|---|
| CN | 112447533 | A | 3/2021 |
| CN | 108270413 | B | 7/2021 |
| CN | 114497025 | A | 5/2022 |
| TW | 200819879 | A | 5/2008 |
| TW | 201415973 | A | 4/2014 |

* cited by examiner

COMPOSITE SUBSTRATE AND METHOD FOR MANUFACTURING THE SAME, ELECTRONIC DEVICE

This is a National Phase Application filed under 35 U.S.C. 371 as a national stage of PCT/CN2022/105668, filed Jul. 14, 2022, the content of each of which is hereby incorporated by reference in its entirety.

TECHNICAL FIELD

The present disclosure relates to the field of semiconductor packaging technologies, and in particular, to a composite substrate, a method for manufacturing a composite substrate, and an electronic device.

BACKGROUND

Packaging of semiconductor devices includes placing a chip on a surface of a substrate, and leading circuit pins of the chip to the outside through wires of the substrate to be connected to external circuits. The substrate and the chip are generally provided with a housing made of polymer. The substrate and the housing play a role in fixing, sealing, protecting the chip, enhancing electrical and thermal performances, and so on. The packaged chip is more convenient to be installed and transported. The substrate for packaging (i.e., package substrate) and a packaging process directly affect performances of the chip and a design and a preparation of a PCB (Printed Circuit Board) connected to the chip.

According to different application scenarios, expectations for the package substrate are different, mainly in terms of dimensional specifications, electrical properties, mechanical properties and thermal properties. In the field of advanced packaging, the package substrate is expected to be provided with characteristics such as fine wiring, multi-layer ultra-thin structure, low signal transmission loss, high mechanical strength, a coefficient of thermal expansion (CTE) matching with the chip and the circuit board, and so on.

Currently, commercially available package substrates are divided into organic substrates, ceramic substrates, metal substrates and composite substrates. The organic substrates are widely applied in fields of traditional packaging and advanced packaging. A line width/line distance (L/S) of wiring of a conventional substrate is greater than or equal to 30 μm/30 μm, and along with a refinement of wiring of the chip, and an increasing of the number of pins (I/O) of the chip, the L/S of the substrate is gradually reduced to 9 μm/12 μm, or even less than or equal to 5 μm/5 μm, and the number of layers of the substrate is accordingly increased to greater than or equal to (8~n~8) layers. Since the mechanical strength and the CTE of the package substrate both affect stability of the packaging process and reliability of a packaged device, a substrate made of a material with the CTE, matched with materials of the chip and the circuit board, and a high mechanical strength is expected to be selected for packaging.

With improvement of the semiconductor manufacturing process, a refinement degree of the chip is increased (the L/S is reduced and the number of I/Os is increased), the wiring of the substrate is in a micrometer scale due to the manufacturing process of the substrate, so that the chip and the substrate cannot be directly connected, and an interposer is expected to be introduced between the chip and the substrate for transition. As an increasing of expectations of the market for an integration of the semiconductor devices, expectations in system-in-package (SiP) are also increasing, and in a case where two or more devices are packaged together, the number of the I/Os in a limited area is relatively large, and signals are desired to be transmitted between some chips, and thus the interposer is also desired to reduce a path for transmitting the signals and carry more pins.

In summary, in chip-in-package or system-in-package with a relatively large number of I/Os and a relatively much heat dissipation, a fine interposer and a low-loss package substrate with a good performance of heat dissipation and a moderate CTE are expected to be selected.

SUMMARY

The present disclosure aims to solve at least one technical problem in the existing art, and provides a composite substrate, a method for manufacturing a composite substrate, and an electronic device.

In a first aspect, the present disclosure provides a composite substrate including a package substrate and an interposer which are stacked, the interposer includes: a first dielectric substrate including a first connection via penetrating through the first dielectric substrate along a thickness direction, in which a thickness of the first dielectric substrate extends, of the first dielectric substrate, and a first surface and a second surface opposite to each other along the thickness direction of the first dielectric substrate; a first connection electrode disposed in the first connection via; and a first connection structure and a second connection structure respectively disposed on the first surface and the second surface and both connected to the first connection electrode, the package substrate includes: a second dielectric substrate on a side of the second connection structure away from the first dielectric substrate; a third connection structure and a fourth connection structure which are disposed on the second dielectric substrate and are electrically connected, the third connection structure is electrically connected to the first connection electrode through the second connection structure.

In some implementations, the second connection structure and the third connection structure are directly contacted with each other.

In some implementations, the interposer further includes a first redundant electrode disposed on the second surface and located in a peripheral region, the package substrate further includes a second redundant electrode disposed on a side of the second dielectric substrate close to the second connection structure and located in the peripheral region; the first redundant electrode and the second redundant electrode are connected by bonding.

In some implementations, the second connection structure and the third connection structure are connected by a connection structure.

In some implementations, a first insulation layer is disposed on a side of the second connection structure away from the second surface, a first via is provided at a position of the first insulation layer corresponding to the second connection structure, and a first transfer electrode is disposed in the first via; a second insulation layer is disposed on a side of the third connection structure away from the second dielectric substrate, a second via is provided at a position of the second insulation layer corresponding to the third connection structure, a second transfer electrode is disposed in the second via; the first transfer electrode is soldered together with the second transfer electrode.

In some implementations, a third insulation layer is disposed on a side of the first connection structure away from the first surface, a third via is provided at a position of the third insulation layer corresponding to the first connection structure, and a third transfer electrode is disposed in the third via; a fourth insulation layer is disposed on a side of the fourth connection structure away from the second dielectric substrate, a fourth via is provided at a position of the fourth insulation layer corresponding to the fourth connection structure, and a fourth transfer electrode is disposed in the fourth via; the third transfer electrode is configured to be electrically connected to a chip to be installed; the fourth transfer electrode is configured to be electrically connected to a printed circuit board to be installed.

In some implementations, the first connection structure includes a plurality of first sub-electrodes, in multiple layers, sequentially disposed on the first surface, and a fifth insulation layer is disposed between any adjacent ones of the first sub-electrodes, and the first sub-electrodes adjacent to each other are electrically connected through a fifth via penetrating through the fifth insulation layer between the first sub-electrodes.

In some implementations, the second connection structure includes a plurality of second sub-electrodes, in multiple layers, sequentially disposed on the second surface, a sixth insulation layer is disposed between any adjacent ones of the second sub-electrodes, and the second sub-electrodes adjacent to each other are electrically connected through a sixth via penetrating through the sixth insulation layer between the second sub-electrodes.

In some implementations, the first dielectric substrate is provided with a second connection via penetrating through the first dielectric substrate along the thickness direction of the first dielectric substrate, and a second connection electrode is disposed in the second connection via; the first dielectric substrate includes a third surface and a fourth surface opposite to each other along the thickness direction of the first dielectric substrate; and third surface is closer to the second surface than the fourth surface; the third connection structure is disposed on the third surface, the fourth connection structure is disposed on the fourth surface, and the third connection structure is electrically connected to the fourth connection structure through the second connection electrode.

In some implementations, the third connection structure includes a plurality of third sub-electrodes, in multiple layers, sequentially disposed on the third surface, and a seventh insulation layer is disposed between any adjacent ones of the third sub-electrodes, and the third sub-electrodes adjacent to each other are electrically connected through a seventh via penetrating through the seventh insulation layer between the third sub-electrodes.

In some implementations, the fourth connection structure includes a plurality of fourth sub-electrodes, in multiple layers, sequentially disposed on the fourth surface, and an eighth insulation layer is disposed between any adjacent ones of the fourth sub-electrodes, and the fourth sub-electrodes adjacent to each other are electrically connected through an eighth via penetrating through the eighth insulation layer between the fourth sub-electrodes.

In some implementations, materials of the first dielectric substrate and the second dielectric substrate are the same as each other.

In some implementations, the third connection structure and the fourth connection are disposed in a same layer, and a ninth insulation layer is disposed between the layer where the third connection structure and the fourth connection structure are disposed and the second dielectric substrate.

In some implementations, the second dielectric substrate includes a metal substrate or a metal-ceramic composite substrate.

In some implementations, the first dielectric substrate includes a glass substrate.

In some implementations, the second dielectric substrate includes a ceramic substrate.

In some implementations, the composite substrate further includes a chip and a printed circuit board; the chip is electrically connected to the first connection structure; the printed circuit board is electrically connected to the fourth connection structure.

In a second aspect, the present disclosure provides a method for manufacturing a composite substrate, including forming a package substrate and an interposer, and electrically connecting the package substrate with the interposer, the forming an interposer includes: providing a first dielectric substrate including a first connection via penetrating through the first dielectric substrate along a thickness direction, in which a thickness of the first dielectric substrate extends, of the first dielectric substrate, and a first surface and a second surface opposite to each other along the thickness direction of the first dielectric substrate; and forming a first connection electrode in the first connection via, forming a first connection structure on the first surface, and forming a second connection structure on the second surface, the first connection structure being electrically connected to the second connection structure through the first connection electrode, the forming a package substrate includes: providing a second dielectric substrate; and forming a third connection structure and a fourth connection structure on the second dielectric substrate, the third connection structure being configured to be electrically connected to the first connection electrode through the second connection structure.

In some implementations, the electrically connecting the package substrate with the interposer includes: bonding the first dielectric substrate formed with the second connection structure with the second dielectric substrate formed with the third connection structure, electrically connecting the package substrate and the interposer through a bonding connection between the second connection structure and the third connection structure.

In some implementations, a first redundant electrode is further formed in a peripheral region during forming the second connection structure; a second redundant electrode is further formed in the peripheral region during forming the third connection structure; in response to that the second connection structure and the third connection structure are connected by bonding, the first redundant electrode and the second redundant electrode are connected by bonding.

In some implementations, the electrically connecting the package substrate with the interposer includes: soldering the second connection structure with the third connection structure together, so as to electrically connect the packaging substrate with the interposer.

In a third aspect, the present disclosure provides an electronic device including the composite substrate described in the first aspect.

DETAIL DESCRIPTION OF EMBODIMENTS

In order to make those skilled in the art better understand the technical solutions of the present disclosure, the present disclosure is further described in detail with reference to the accompanying drawings and the detailed description below.

Unless otherwise defined, meanings of technical terms and scientific terms used in the present disclosure are commonly understood by one of ordinary skill in the art. Terms "first", "second", and the like, as used in the disclosure, do not denote any order, quantity, or significance, but are used only to distinguish between different components. Similarly, similar terms such as "a", "one" or "the" do not indicate a quantitative limitation, but indicate an existence of at least one. Terms such as "includes" or "comprises" are intended to mean that elements or objects preceded by the terms encompasses enumerated elements or objects following the terms and equivalents thereof, and do not exclude other elements or objects. Terms such as "connection" or "connected" are not limited to physical or mechanical connections, but may include electrical connections, whether direct or indirect. Terms "up", "down", "left", "right", etc. are only used to represent relative positional relationships, when an absolute position of the object being described changes, the relative positional relationship may change accordingly.

Figure 1:
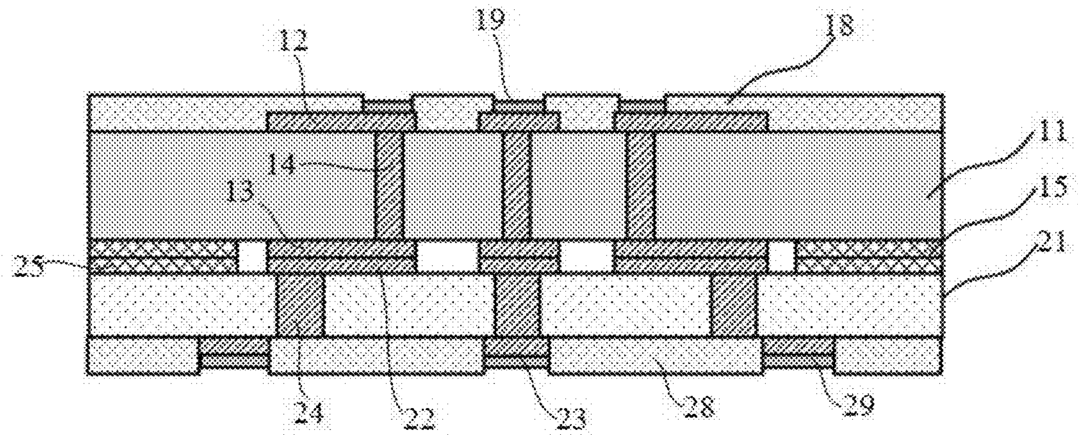
FIG. 1 is a schematic structural diagram of a composite substrate according to the present disclosure.
Figure 2:
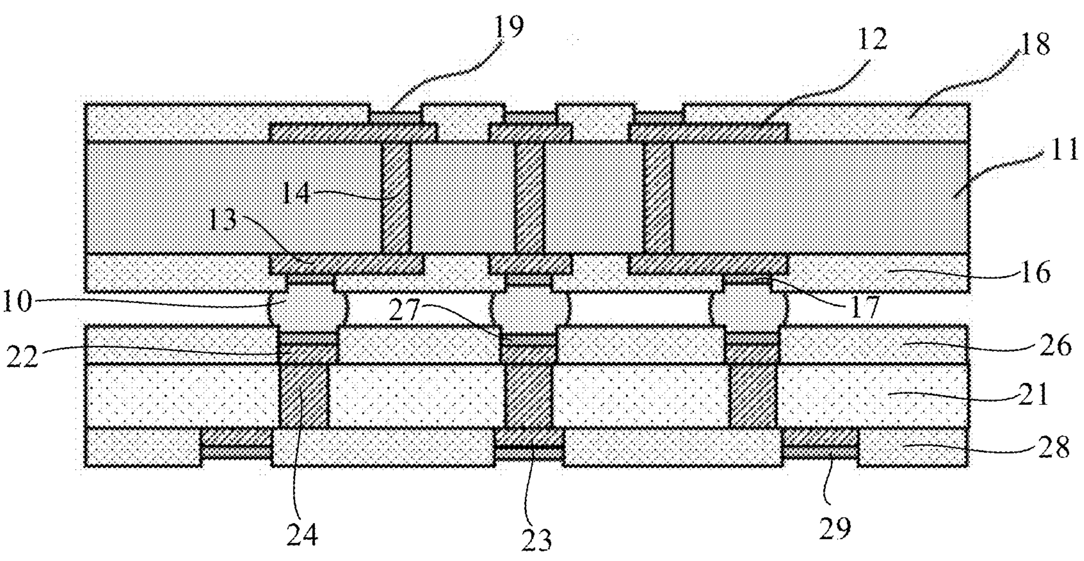
FIG. 2 is a schematic structural diagram of a composite substrate according to the present disclosure.
Figure 3:
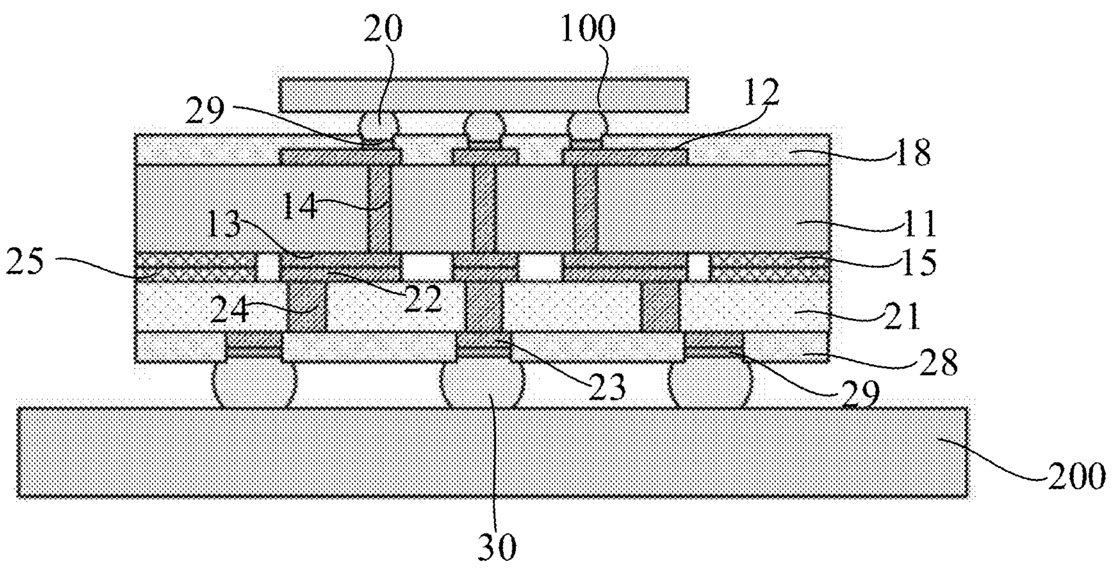
FIG. 3 is a schematic diagram illustrating a connection between an interposer and a chip and a connection between a package substrate and a printed circuit board in the composite substrate shown in FIG. 1.
Figure 4:
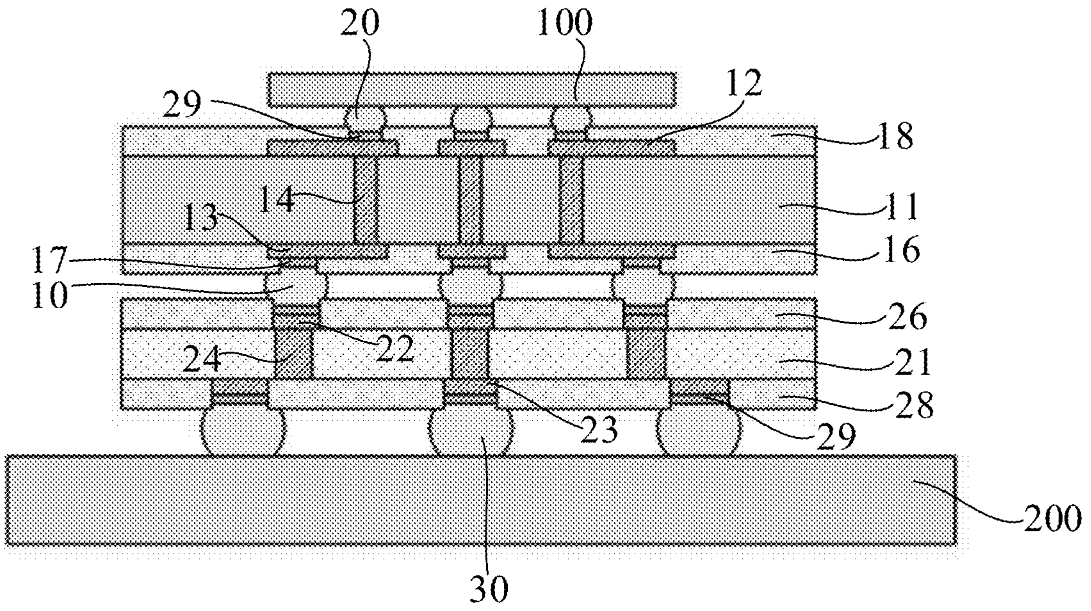
FIG. 4 is a schematic diagram illustrating a connection between an interposer and a chip and a connection between a package substrate and a printed circuit board in the composite substrate shown in FIG. 1.

In a first aspect, FIG. 1 is a schematic structural diagram of a composite substrate according to the present disclosure; FIG. 2 is a schematic structural diagram of a composite substrate according to the present disclosure; FIG. 3 is a schematic diagram illustrating a connection between an interposer and a chip and a connection between a package substrate and a printed circuit board in the composite substrate shown in FIG. 1; FIG. 4 is a schematic diagram illustrating a connection between an interposer and a chip and a connection between a package substrate and a printed circuit board in the composite substrate shown in FIG. 1. Referring to FIG. 1 to FIG. 4, the present disclosure provides a composite substrate including a package substrate and an interposer. A chip is electrically connected to a circuit on the package substrate through the interposer, and the circuit on the package substrate is electrically connected to an external circuit, such as a printed circuit board.

In the present disclosure, the interposer includes a first dielectric substrate 11, a first connection structure 12, a second connection structure 13, and a first connection electrode 14. The first dielectric substrate 11 is provided with a first connection via 101 penetrating through the first dielectric substrate 11 along a thickness direction, in which a thickness of the first dielectric substrate 11 extends, of the first dielectric substrate 11, the first connection electrode 14 is disposed in the first connection via 101. The first dielectric substrate 11 includes a first surface and a second surface opposite to each other along the thickness direction of the first dielectric substrate 11. The first connection structure 12 is disposed on the first surface of the first dielectric substrate 11, the second connection structure 13 is disposed on the second surface of the first dielectric substrate 11 and electrically connected to the first connection structure 12 through the first connection electrode 14 in the first connection via 101.

The package substrate includes a second dielectric substrate 21, a third connection structure 22, and a fourth connection structure 23. The second dielectric substrate 21 is disposed on a side of the second connection structure 13 of the interposer away from the first dielectric substrate 11. The third connection structure 22 and the fourth connection structure 23 are electrically connected and are both disposed on the second dielectric substrate 21. The third connection structure 22 is electrically connected to the second connection structure 13.

It should be noted that the first connection structure 12 is electrically connected to the chip to be packaged, the fourth connection structure 23 is electrically connected to the printed circuit board. In this case, a signal provided by the printed circuit board is transmitted to the package substrate and transmitted to the chip through the interposer, thereby implementing an electrical connection between the printed circuit board and the chip.

In the present disclosure, the first connection structure 12 and the second connection structure 13 on the interposer are electrically connected through the first connection electrode 14 disposed in the first connection via 101 penetrating through the first dielectric substrate 11 of the interposer, so that an integration degree of the composite substrate is effectively improved, which is beneficial to realize lightness and thinness of the composite substrate.

In some examples, the first dielectric substrate 11 of the interposer may be a glass substrate, and the glass substrate is selected because it is convenient to form fine wiring on the glass substrate, which facilitates to reduce an overall thickness of the composite substrate, reduce the signal loss, and improve the integration degree. Certainly, in the present disclosure, the first dielectric substrate 11 is not limited to be the glass substrate, and other substrates made of low-loss materials may also be selected.

In some examples, the second dielectric substrate 21 of the package substrate may be a ceramic substrate, and the ceramic substrate is selected because the ceramic substrate has good performance of heat dissipation, and is electrically connected to the interposer to improve the performance of heat dissipation. Certainly, the second dielectric substrate 21 of the package substrate includes, but is not limited to, the ceramic substrate, and a glass substrate, a metal substrate, an organic substrate, a metal ceramic composite substrate or the like may also be selected. In a case where the second dielectric substrate 21 is the organic substrate, a material of the organic substrate includes, but is not limited to, BT resin (Bismaleimide Triazine resin), ABF (Ajinomoto Build-up Film), and the like. A material of the first dielectric substrate 11 may also be selected according to a structural arrangement of the third connection structure 22 and the fourth connection structure 23 of the package substrate, which is described in detail below.

In some examples, the interposer and the package substrate may be electrically connected by bonding or soldering.

For example, in a case where the interposer is bonded to the package substrate, the second connection structure 13 on the interposer directly contacts the third connection structure 22 on the package substrate, so as to implement the electrical connection between the interposer and the package substrate. Referring to FIG. 1 and FIG. 3, in order to ensure strength, a first redundant electrode 15 is further disposed on the second surface of the first dielectric substrate 11 and located in a peripheral region, a second redundant electrode 25 is disposed on a side of the second dielectric substrate 21 close to the second connection structure 13, and in response to that the second connection structure 13 and the third connection structure 22 are connected by bonding, the first redundant electrode 15 and the second redundant electrode 25 are connected by bonding. It should be noted that, the first redundant electrode 15 is not connected to the second connection structure 13, and in a case where the second connection structure 13 is a single-layer structure, the second connection structure 13 and the first redundant electrode 15 are disposed in a same layer and can be prepared by a same process, in a case where the second connection structure 13 is a multi-layer structure, the first redundant electrode 15 and a layer of structure of the second connection structure 13 farthest from the second surface are disposed in a same layer and can be prepared by a same process. Similarly, the second redundant electrode 25 is not connected to the third connection structure 22, and in a case where the third connection structure 22 is a single-layer structure, the third connection structure 22 and the second redundant electrode 25 are disposed in a same layer and can be prepared by a same process, in a case where the third connection structure 22 is a multi-layer structure, the second redundant electrode 25 and a layer of structure of the third connection structure 22 farthest from the second dielectric substrate 21 are disposed in a same layer and can be prepared by a same process. The first redundant electrode 15 and the second redundant electrode 25 each may be a ring-shaped structure or may be a structure formed by a plurality of sub-electrodes disposed at intervals.

In a case where the interposer and the package substrate are connected by soldering, the second connection structure 13 on the interposer is connected to the third connection structure 22 on the package substrate through a connection structure. Specifically, referring to FIG. 2 and FIG. 4, a first insulation layer 16 is disposed on a side of the second connection structure 13 of the interposer away from the first dielectric substrate 11, a first via is provided at a position of the first insulation layer 16 corresponding to the second connection structure 13, and a first transfer electrode 17 is disposed in the first via; a second insulation layer 26 is disposed on a side of the third connection structure 22 away from the second dielectric substrate 21, a second via is provided at a position of the second insulation layer 26 corresponding to the third connection structure 22, a second transfer electrode 27 is disposed in the second via; the first transfer electrode 17 is soldered together with the second transfer electrode 27, i.e., a connection structure is formed between the first transfer electrode 17 and the second transfer electrode 27, so that the first transfer electrode 17 and the second transfer electrode 27 are electrically connected. For example, materials of the first transfer electrode 17 and the second transfer electrode 27 may be nickel-gold or nickel-palladium-gold. The connection structure 10 may be soldered by a solder bump or a copper pillar structure.

In some examples, referring to FIG. 3 and FIG. 4, the interposer and the package substrate are connected together by bonding or soldering. The first connection structure 12 and the chip to be packaged may be connected by soldering, and the fourth connection structure 23 and the printed circuit board may be connected by soldering.

Specifically, a third insulation layer 18 is disposed on a side of the first connection structure 12 away from the first surface, a third via is provided at a position of the third insulation layer 18 corresponding to the first connection structure 12, and a third transfer electrode 19 is disposed in the third via; a fourth insulation layer 28 is disposed on a side of the fourth connection structure 23 away from the second dielectric substrate 21, a fourth via is provided at a position of the fourth insulation layer 28 corresponding to the fourth connection structure 23, and a fourth transfer electrode 29 is disposed in the fourth via; the third transfer electrode 19 is configured to be electrically connected to the chip to be installed; the fourth transfer electrode 29 is configured to be electrically connected to the printed circuit board to be installed. For example, materials of the third transfer electrode 19 and the fourth transfer electrode 29 may be nickel-gold or nickel-palladium-gold. The third transfer electrode 19 and the chip may be soldered together by using a solder bump or a copper pillar structure 20. The fourth transfer electrode 29 and the printed circuit board may be soldered together by using a solder bump or a copper pillar structure 30. Materials of the third insulation layer 18 and the fourth insulation layer 28 may be an insulating material such as solder resist ink.

Examples of specific structures of the interposer and the package substrate in the present disclosure are illustrated below.

First, the interposer in the present disclosure is described, the first connection structure 12 and the second connection structure 13 on the interposer are electrically connected through the first connection electrode 14 in the first connection via 101 of the first dielectric substrate 11, so as to implement an interconnection between chips, and an electrical connection, with a higher density, between the chip and the package substrate.

Figure 5:
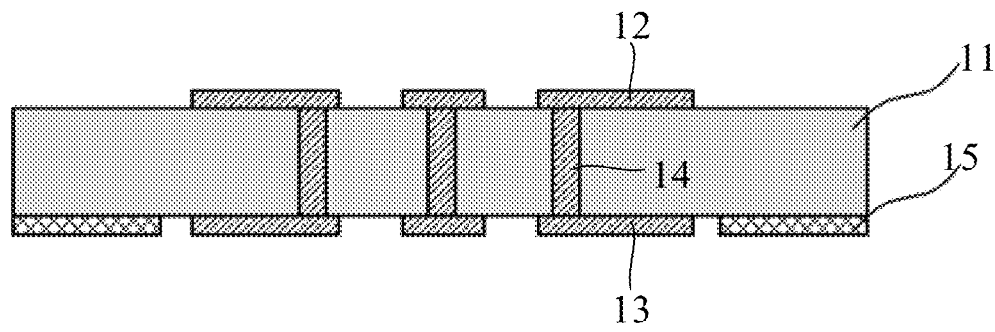
FIG. 5 is a schematic structural diagram of a first example of an interposer of a composite substrate according to the present disclosure.
Figure 6:
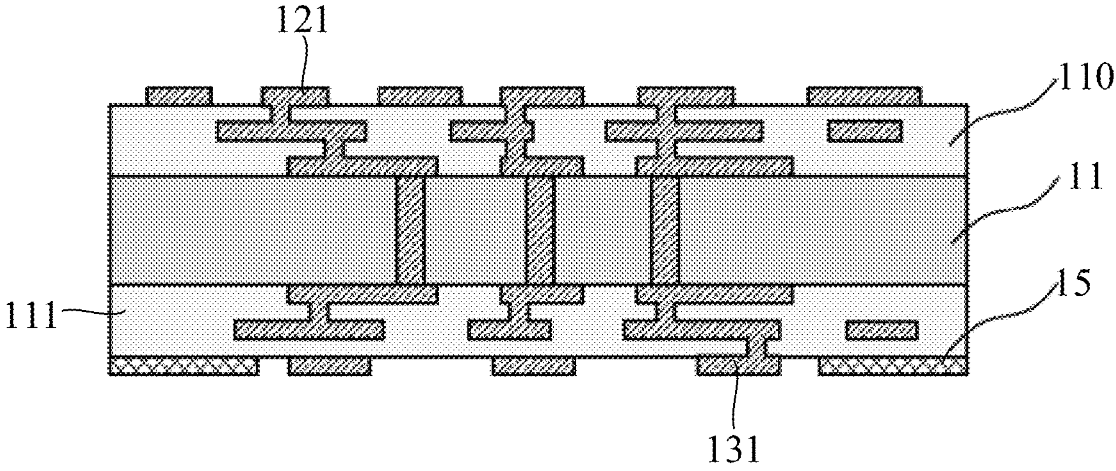
FIG. 6 is a schematic structural diagram of a second example of an interposer of a composite substrate according to the present disclosure.

FIG. 5 is a schematic structural diagram of a first example of an interposer of a composite substrate according to the present disclosure; FIG. 6 is a schematic structural diagram of a second example of an interposer of a composite substrate according to the present disclosure; as shown in FIG. 5 and FIG. 6, the first connection structure 12 and the second connection structure 13 on the interposer may be single-layer structures or multi-layer structures. In a case where the first connection structure 12 and the second connection structure 13 are the single-layer structures, i.e., as shown in FIG. 5, the first connection structure 12 and the second connection structure 13 are respectively formed on the first surface and the second surface of the first dielectric substrate 11. As shown in FIG. 6, in a case where the first connection structure 12 and the second connection structure 13 are the multi-layer structures, the first connection structure 12 includes a plurality of first sub-electrodes 121, in multiple layers, sequentially disposed on the first surface, and a fifth insulation layer 110 is disposed between any adjacent ones of the first sub-electrodes 121, and the first sub-electrodes 121 adjacent to each other are electrically connected through a fifth via penetrating through the fifth insulation layer 110 between the first sub-electrodes 121. The first sub-electrode 121 of the first connection structure 12 farthest away from the first dielectric substrate 11, is electrically connected to the chip to be packaged, the first sub-electrode 121 disposed on the first surface of the first dielectric substrate 11 is electrically connected to the first connection electrode 14 in the first connection via 101. The second connection structure 13 includes a plurality of second sub-electrodes 131, in multiple layers, sequentially disposed on the second surface, a sixth insulation layer 111 is disposed between any adjacent ones of the second sub-electrodes 131, and the second sub-electrodes 131 adjacent to each other are electrically connected through a sixth via penetrating through the sixth insulation layer 111 between the second sub-electrodes 131. The second sub-electrode 131 of the second connection structure 13 farthest away from the first dielectric substrate 11, is electrically connected to the third connection structure 22, and the second sub-electrode 131 disposed on the second surface of the first dielectric substrate 11 is electrically connected to the first connection electrode 14 in the first connection via 101.

Further, materials of the first sub-electrodes 121 in the first connection structure 12 and materials of the second sub-electrodes 131 in the second connection structure 13 each include, but are not limited to, copper. Materials of the fifth insulation layer 110 and the sixth insulation layer 111 include, but are not limited to, PI (polyimide), BCB (Benzocyclobutene), PBO (polybenzoxazole), and other materials with a relatively low dielectric constant, a relatively low dielectric loss.

Next, a structure of the package substrate is described, the third connection structure 22 and the fourth connection structure 23 on the package substrate are disposed on a same side of the second dielectric substrate 21, for example, in a same layer, certainly, the third connection structure 22 and the fourth connection structure 23 may also be disposed on different surfaces of the second dielectric substrate 21. The third connection structure 22 and the fourth connection structure 23 each may be a single-layer structure or a multi-layer structure.

A First Example

Figure 7:
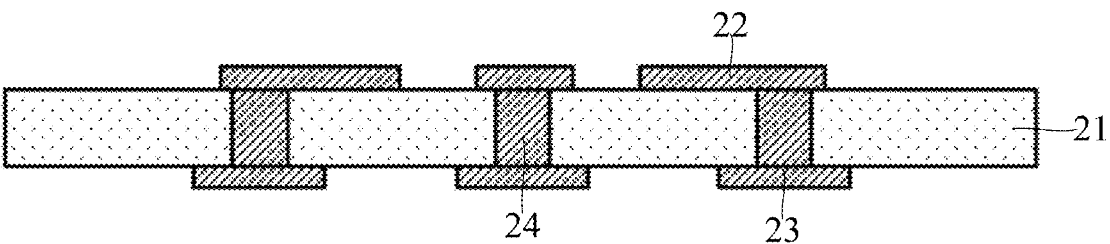
FIG. 7 is a schematic structural diagram of a first example of a package substrate of a composite substrate according to the present disclosure.

FIG. 7 is a schematic structural diagram of a first example of a package substrate of a composite substrate according to the present disclosure; as shown in FIG. 7, the second dielectric substrate 21 is provided with a second connection via 201 penetrating through the second dielectric substrate 21 along a thickness direction, in which a thickness of the second dielectric substrate 21 extends, of the second dielectric substrate 21, and a second connection electrode 24 is disposed in the second connection via 201. The second dielectric substrate 21 includes a third surface and a fourth surface opposite to each other along the thickness direction of the second dielectric substrate 21; and the third surface is closer to the first dielectric substrate 11 than the fourth surface. The third connection structure 22 is disposed on the third surface, the fourth connection structure 23 is disposed on the fourth surface, and the third connection structure 22 is electrically connected to the fourth connection structure 23 through the second connection electrode 24. The third connection structure 22 and the fourth connection structure 23 are both single-layer structures.

In this case, the second dielectric substrate 21 may be a ceramic substrate made of a ceramic material including $Al_2O_3$, Si—$N_4$, AlN, SiC, or the like. Materials of the third connection structure 22 and the fourth connection structure 23 include, but are not limited to, copper.

A Second Example

Figure 8:
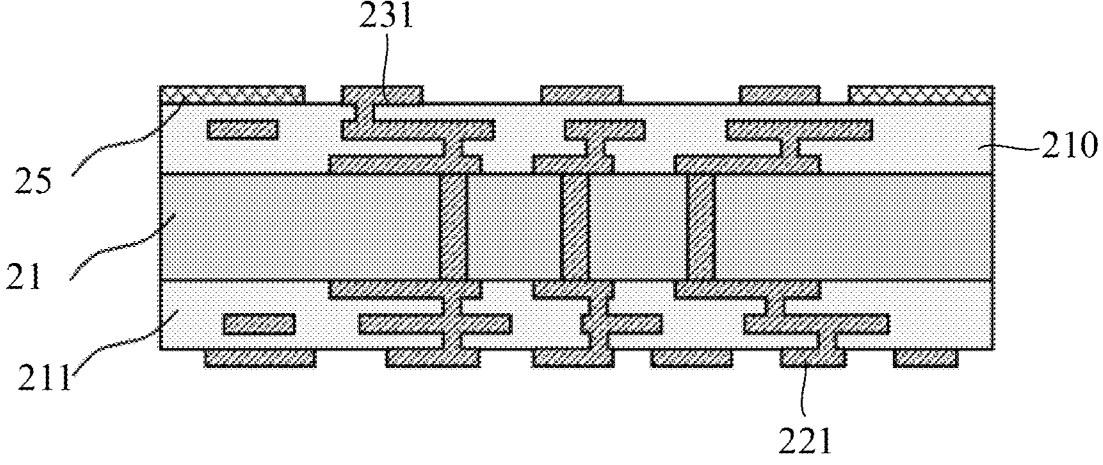
FIG. 8 is a schematic structural diagram of a second example of a package substrate of a composite substrate according to the present disclosure.

FIG. 8 is a schematic structural diagram of a second example of a package substrate of a composite substrate according to the present disclosure; as shown in FIG. 8, the second dielectric substrate 21 is provided with a second connection via 201 penetrating through the second dielectric substrate 21 along a thickness direction, in which a thickness of the second dielectric substrate 21 extends, of the second dielectric substrate 21, and a second connection electrode 24 is disposed in the second connection via 201. The second dielectric substrate 21 includes a third surface and a fourth surface opposite to each other along the thickness direction of the second dielectric substrate 21; and the third surface is closer to the first dielectric substrate 11 than the fourth surface. The third connection structure 22 is disposed on the third surface, the fourth connection structure 23 is disposed on the fourth surface, and the third connection structure 22 is electrically connected to the fourth connection structure 23 through the second connection electrode 24. The third connection structure 22 and the fourth connection structure 23 are both multi-layer structures. Specifically, the third connection structure 22 includes a plurality of third sub-electrodes 221, in multiple layers, sequentially disposed on the third surface, and a seventh insulation layer 210 is disposed between any adjacent ones of the third sub-electrodes 221, and the third sub-electrodes 221 disposed adjacent to each other are electrically connected through a seventh via penetrating through the seventh insulation layer 210 between the third sub-electrodes 221. The third sub-electrode 221 of the third connection structure 22 farthest away from the second dielectric substrate 21, is electrically connected to the second connection structure 13, the third sub-electrode 121 disposed on the third surface is electrically connected to the second connection electrode 24. The fourth connection structure 23 includes a plurality of fourth sub-electrodes 231, in multiple layers, sequentially disposed on the fourth surface, and an eighth insulation layer 211 is disposed between any adjacent ones of the fourth sub-electrodes 231, and the fourth sub-electrodes 231 disposed adjacent to each other are electrically connected through an eighth via penetrating through the eighth insulation layer 211 between the fourth sub-electrodes 231. The fourth sub-electrode 231 of the fourth connection structure 23 farthest away from the second dielectric substrate 21, is electrically connected to the printed circuit board, the fourth sub-electrode 231 disposed on the fourth surface is electrically connected to the second connection electrode 24.

In this case, the second dielectric substrate 21 may be made of the same material as the first dielectric substrate 11, for example, the second dielectric substrate 21 is a glass substrate, but the second dielectric substrate 21 may also be an organic substrate. The seventh insulation layer 210 and the eighth insulation layer 211 are expected to be made of a resin material with a relatively low dielectric loss, for example, may be made of ABF. Materials of the third sub-electrodes 221 of the third connection structure 22 and the fourth sub-electrodes 231 of the fourth connection structure 23 may be copper.

A Third Example

Figure 9:
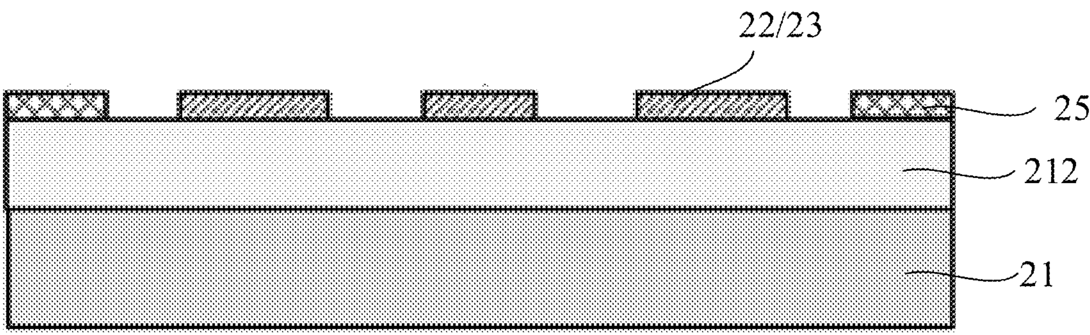
FIG. 9 is a schematic structural diagram of a third example of a package substrate of a composite substrate according to the present disclosure.

FIG. 9 is a schematic structural diagram of a third example of a package substrate of a composite substrate according to the present disclosure; as shown in FIG. 9, the third connection structure 22 and the fourth connection 23 are disposed in a same layer, and a ninth insulation layer 212 is disposed between the layer in which the third connection structure 22 and the fourth connection structure 23 are disposed and the second dielectric substrate 21. In this case, the second dielectric substrate 21 may be a metal substrate (a material thereof may be copper or aluminum) or a metal-ceramic composite substrate, which has a good thermal conductivity.

Only several examples of the interposer and the package substrate are described above, and the composite substrate in the present disclosure may select any above interposer and any above package substrate to implement an electrical connection therebetween by bonding or soldering.

In a second aspect, the present disclosure provide a method for manufacturing the composite substrate described above. The method includes: forming a package substrate and an interposer, and electrically connecting the package substrate with the interposer.

The forming a package substrate and an interposer, and electrically connecting the package substrate with the interposer are described in detail below.

First, an operation of the forming an interposer is illustrated.

A First Example

Figure 10:
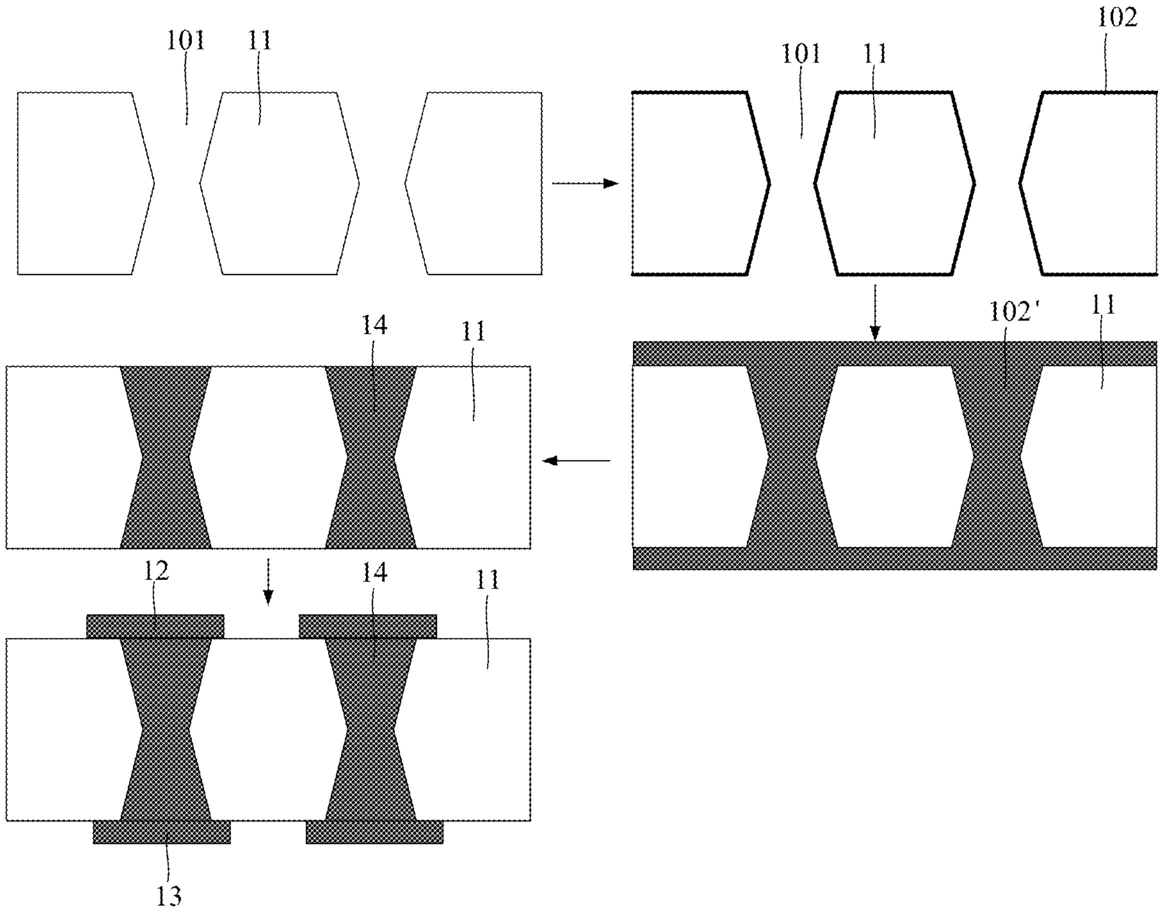
FIG. 10 is a flowchart of a process for manufacturing a first example of an interposer of a composite substrate according to the present disclosure.
Figure 11:
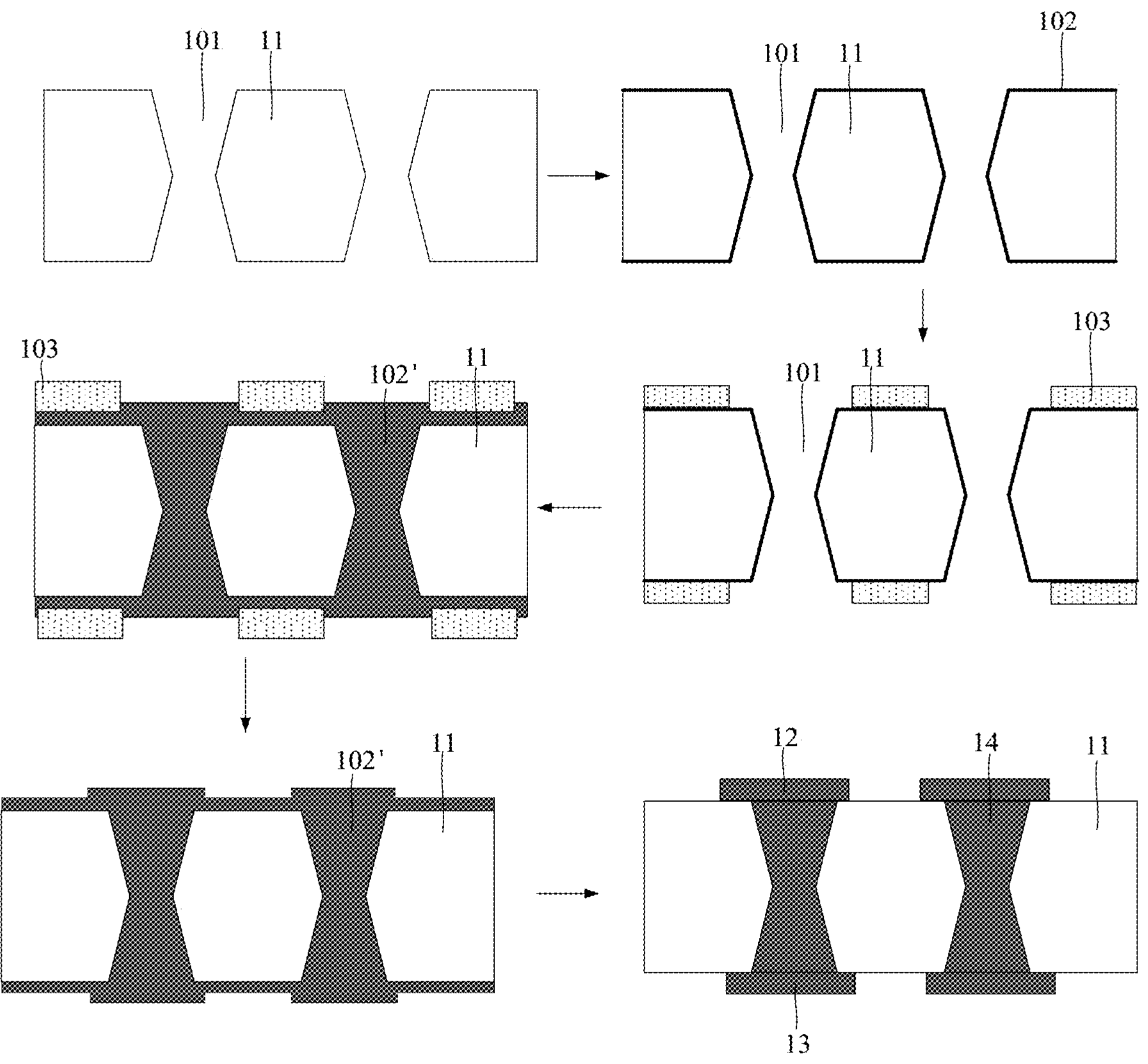
FIG. 11 is a flowchart of a process for manufacturing a first example of an interposer of a composite substrate according to the present disclosure.

FIG. 10 is a flowchart of a process for manufacturing a first example of an interposer of a composite substrate according to the present disclosure. FIG. 11 is a flowchart of a process for manufacturing a first example of an interposer of a composite substrate according to the present disclosure. As shown in FIG. 10 and FIG. 11, the forming an interposer including operations S11 and S12.

At operation S11, providing a first dielectric substrate 11 including a first connection via 101 penetrating through the first dielectric substrate 11 along a thickness direction, in which a thickness of the first dielectric substrate 11 extends, of the first dielectric substrate 11, and a first surface and a second surface opposite to each other along the thickness direction of the first dielectric substrate 11.

In some examples, the first dielectric substrate 11 includes, but is not limited to, a glass substrate, and the first dielectric substrate 11 being a glass substrate is illustrated as an example in the present disclosure. The first dielectric substrate 11 may be formed with the first connection via 101 in advance, or the first connection via 101 (through hole/TGV) may be formed in the glass substrate to form the first dielectric substrate 11.

For example, in a case where a thickness of the glass substrate is greater than or equal to 250 μm, the strength of the glass substrate can ensure a yield of back-end process, so that a through glass via (TGV) serving as the first connection via 101 can be directly formed therein. The process for forming the TGV includes processes of mechanical, laser, chemical etching, a combination of laser modification and wet etching, and other processes, in a case where an aperture of the first connection via 101 is less than or equal to 100 μm, the first connection via 101 is generally prepared by the process of the combination of the laser modification and the wet etching, and a shape of the first connection via 101 is generally a hourglass shape.

At operation S12, forming a first connection electrode 14 in the first connection via 101, forming a first connection structure 12 on the first surface, and forming a second connection structure 13 on the second surface, the first connection structure 12 being electrically connected to the second connection structure 13 through the first connection electrode 14.

In some examples, referring to FIG. 10, operation S12 may include metallizing the first connection via 101 to form the first connection electrode 14 by a subtractive process. A case where materials of the first connection electrode 14, the first connection structure 12 and the second connection structure 13 are all copper is taken as an example. Specifically, a first seed layer 102 is prepared through a process including, but not limited to, a magnetron sputtering process, and copper is filled in the via by double-sided electroplating both the first surface and the second surface of the first dielectric substrate 11, respectively, and the first seed layer 102 is thickened and changed to 102'; then the copper on the surfaces is removed by using a grinding process and a chemical mechanical polishing (CMP) process, only the copper in the via is retained, so as to form the first connection electrode 14 located in the first connection via 101; and then the first connection structure 12 and the second connection structure 13 are respectively formed on the first surface and the second surface, and are formed in a manner including, but not limited to, magnetron sputtering, electroplating, printing, and the like to form a metal conductive layer, and then a pattern including the first connection structure 12/the second connection structure 13 is formed through a patterning process.

In some examples, referring to FIG. 11, operation S12 may include preparing first seed layers 102 in the first connection via, and on the first surface, and the second surface by a semi-additive process, a formation of the first seed layers 102 may adopt a magnetron sputtering process; then, a dry film photoresist 103 is adhered to the first seed layers 102 on the first surface and the second surface, and is exposed and developed to form a pattern; and then a double-sided electroplating process is performed on the first surface and the second surface, and in this case, the first seed layer 102 is thickened and changed to 102', the via is filled, and patterns of the first surface and the second surface are formed; finally, the photoresist is removed, an etching is performed on the entire surfaces, the first seed layer is removed, and the first connection structure 12 and the second connection structure 13 are prepared simultaneously.

It should be noted that, only the first connection structure 12 and the second connection structure 13 being single-layer structures is illustrated as an example, in a case where the first connection structure 12 and the second connection structure 13 are multi-layer structures, that is, the first connection structure 12 includes a plurality of first sub-electrodes 121 in multiple layers, and the second connection structure 13 includes a plurality of second sub-electrodes 131 in multiple layers, the first sub-electrode 121 in a first layer may be formed according to a preparation manner for the first connection structure 12, and other first sub-electrodes 121 may be formed through a patterning process after forming an insulation layer. Similarly, the second sub-electrodes 131 of the second connection structure 13 in a first layer may be formed according to a preparation manner for the second connection structure 13, and other second sub-electrodes 131 may be formed through a patterning process after forming an insulation layer. A material of the insulation layer includes, but is not limited to, PI (polyimide), BCB (Benzocyclobutene), PBO (polybenzoxazole), and other materials with a relatively low dielectric constant, a relatively low dielectric loss.

A Second Example

Figure 12:
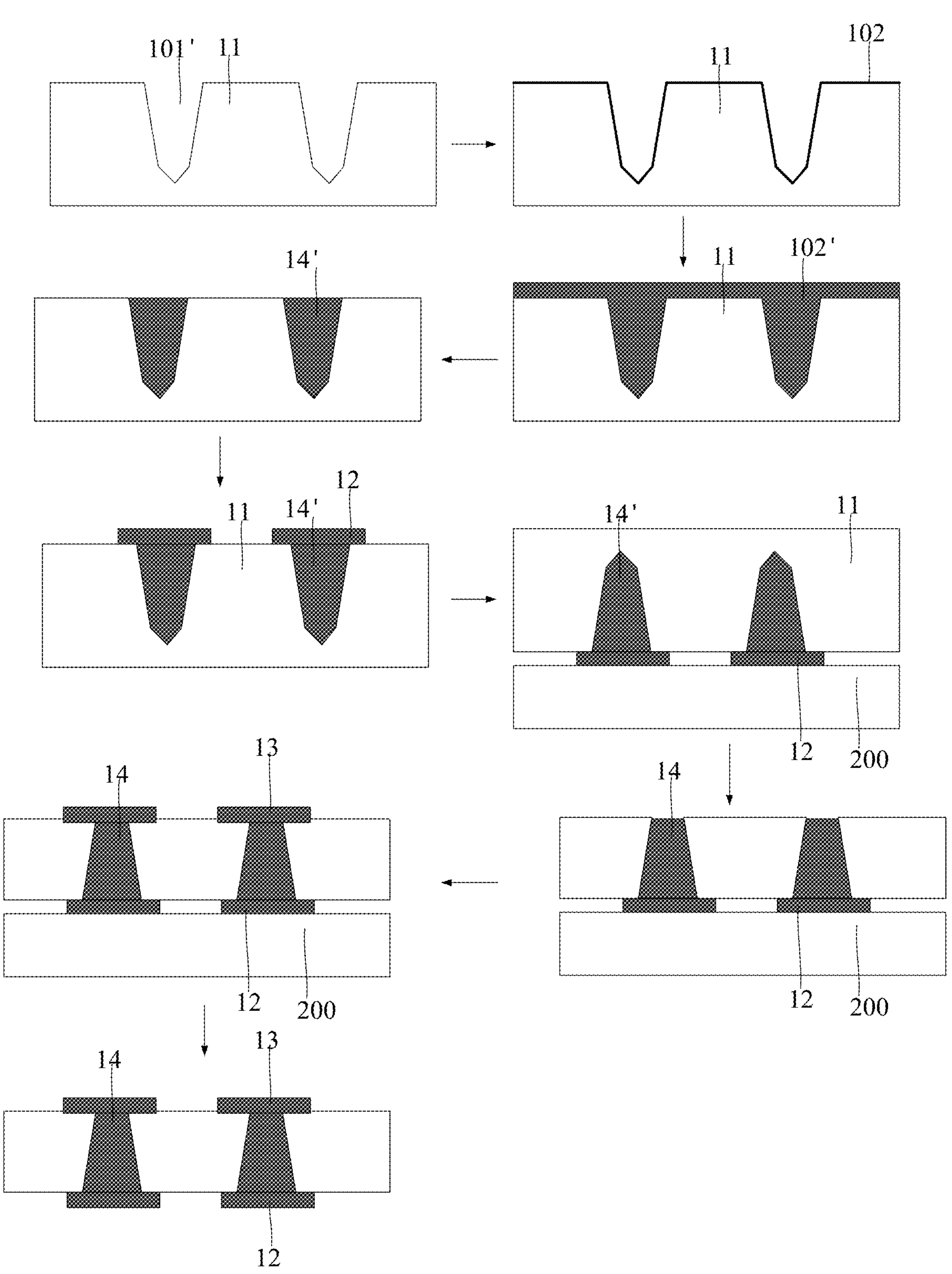
FIG. 12 is a flowchart of a process for manufacturing a second example of an interposer of a composite substrate according to the present disclosure.

FIG. 12 is a flowchart of a process for manufacturing a second example of an interposer of a composite substrate according to the present disclosure; as shown in FIG. 12, the forming an interposer includes operation S21 and S22.

At operation S21, providing a first dielectric substrate 11, and forming a blind glass via (BGV) 101' in the first dielectric substrate 11.

In some examples, the first dielectric substrate 11 includes, but is not limited to, a glass substrate. In a case where a final thickness of the glass substrate is less than 250 μm, a thicker glass is generally used to increase strength in order to ensure the yield of the back-end process, and a blind glass via (BGV) 101' is expected to be prepared. A preparation process for the BGV includes mechanical, laser, chemical etching, a combination of laser modification and wet etching, and other processes, in a case where an aperture of the BGV is less than or equal to 100 μm, the BGV is generally prepared by the process of the combination of the laser modification and the wet etching, and a shape of the BGV is generally a hourglass shape.

At operation S22, forming a first connection via 101, a first connection electrode 14 located in the first connection via 101, a first connection structure 12 and a second connection structure 13 respectively disposed at opposite openings of the first connection via 101.

In some examples, operation S22 may include metallizing the BGV 101', i.e., forming and electroplating the first seed layer 102, in this case, the first seed layer 102 is thickened and changed to 102', and after removing the copper on the surfaces, forming a connection electrode 14' located in the BGV, and preparing the first connection structure 12; then temporarily bonding a carrier glass 200 on a side of the first connection structure 12, thinning the glass at a bottom of the BGV until the first connection electrode 14 is exposed, and polishing the glass using a CMP process to reduce roughness; then, preparing the second connection structure, and finally, debonding, the first connection via 101, the first connection electrode 14 located in the first connection via 101, and the first connection structure 12 and the second connection structure 13 respectively disposed at opposite openings of the first connection via 101, and the manufacturing is finished.

In a case where the first connection structure 12 and the second connection structure 13 are multi-layer structures, the manner for manufacturing may be same as that in the first example, and thus is not repeated herein.

Next, an operation of the forming a package substrate is described. It should be noted that, only a case where the second dielectric substrate 21 is a ceramic substrate, and the third connection structure 22 and the fourth connection structure 23 are respectively formed on the third surface and the fourth surface of the second dielectric substrate 21 is illustrated as an example below.

Figure 13:
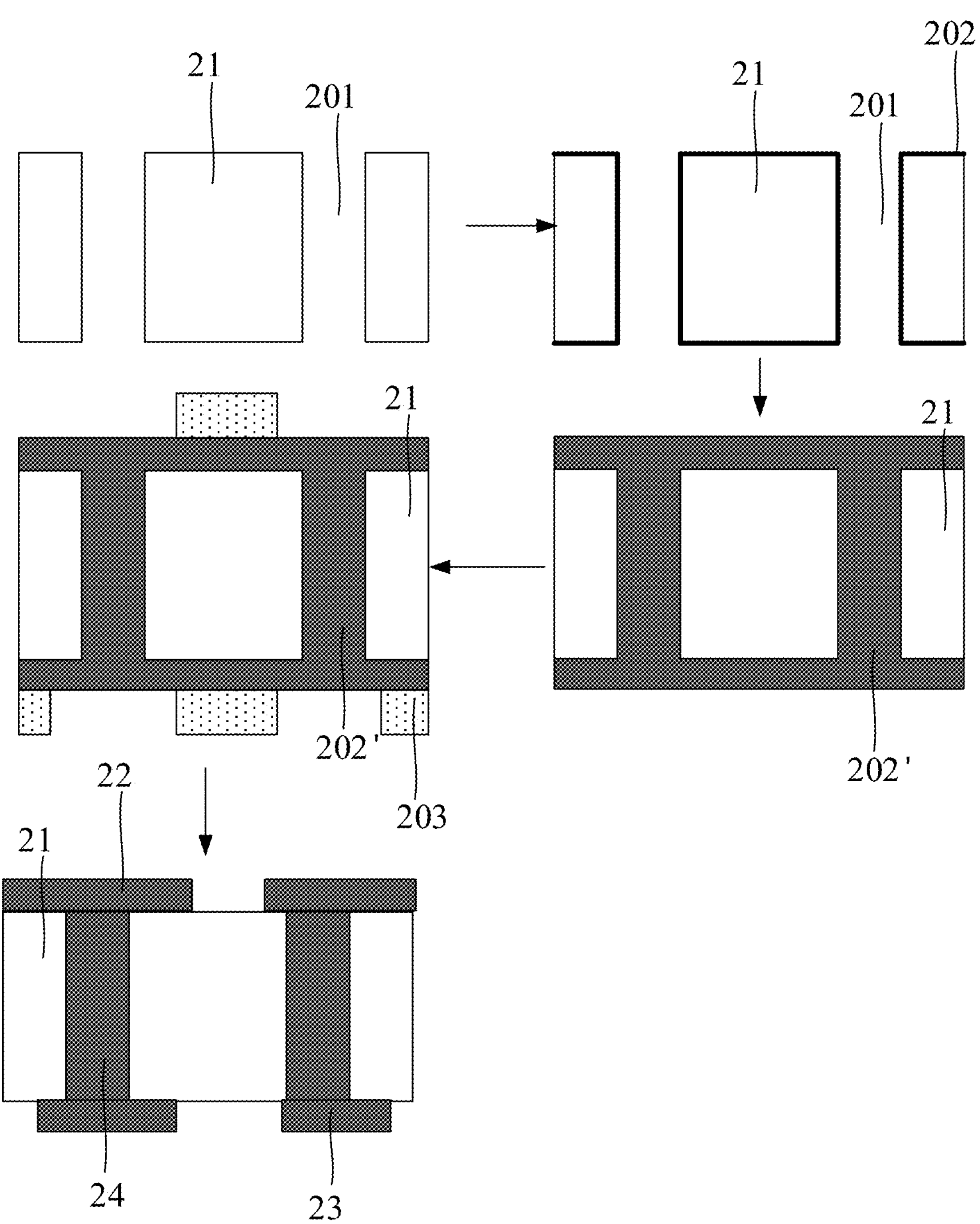
FIG. 13 is a flowchart of a process for manufacturing a package substrate of a composite substrate according to the present disclosure.

FIG. 13 is a flowchart of a process for manufacturing a package substrate of a composite substrate according to the present disclosure; as shown in FIG. 13, the forming a package substrate specifically includes operations S31 and S32.

At operation S31, providing a second dielectric substrate 21 having a second connection via 201 therein penetrating through the second dielectric substrate 21 along a thickness direction, in which a thickness of the second dielectric substrate 21 extends, of the second dielectric substrate 21, and including a third surface and a fourth surface opposite to each other along the thickness direction of the second dielectric substrate 21.

In some examples, in operation S31, a laser is used to punch a via in a surface of the ceramic substrate to form the second connection via 201, and an aperture of the second connection via 201 is greater than or equal to 50 μm.

At operation S32, forming a second connection electrode 24 in the second connection via 201, and respectively forming a third connection structure 22 and a fourth connection structure 23 on the third surface and the fourth surface.

In some examples, operation S32 may include, but be not limited to, preparing a second seed layer 202 using a magnetron sputtering process, a material of the second seed layer 202 includes, but is not limited to, copper. The double-sided electroplating is performed on the third surface and the fourth surface, so that copper is filled in the second connection via 201 and the copper on the surfaces is thickened, and the second seed layer 202 is thickened and changed to 202', and according to a final expectation for a thickness of the copper, the thickness and roughness of the copper on the surfaces may be adjusted by using processes such as chemical etching, physical grinding, CMP and the like; and then patterns of the third connection structure 22 on the third surface and the fourth connection structure 23 on the fourth surface can be finally formed by attaching a dry film 203, exposing, developing, etching, and removing the photoresist.

Finally, an operation of the connecting the package substrate with the interposer is described below.

In some examples, the interposer may be connected to the package substrate by soldering using a solder bump or a copper pillar structure. For example, forming a first insulation layer 16 on a side of the second connection structure 13 of the interposer away from the first dielectric substrate 11, a first via is formed at a position of the first insulation layer 16 corresponding to the second connection structure 13, and a first transfer electrode 17 is disposed in the first via; a second insulation layer 26 is formed on a side of the third connection structure 22 away from the second dielectric substrate 21, a second via is formed at a position of the second insulation layer 26 corresponding to the third connection structure 22, a second transfer electrode 27 is formed in the second via; the first transfer electrode 17 is soldered together with the second transfer electrode 27. For example, materials of the first transfer electrode 17 and the second transfer electrode 27 may be nickel-gold or nickel-palladium-gold. The first transfer electrode 17 and the second transfer electrode 27 may be soldered together by a solder bump or a copper pillar structure.

In some examples, the package substrate may be connected to the interposer by bonding. For example, the second connection structure 13 on the interposer and the third connection structure 22 on the package substrate may be bonded. In order to ensure strength, a first redundant electrode 15 is further formed on the second surface of the first dielectric substrate 11 and located in a peripheral region, a second redundant electrode 25 is formed on a side of the second dielectric substrate 21 close to the second connection structure 13, in a case where the second connection structure 13 and the third connection structure 22 are connected by bonding, the first redundant electrode 15 and the second redundant electrode 25 are connected by bonding. It should be noted that, the first redundant electrode 15 is not connected to the second connection structure 13, and in a case where the second connection structure 13 is a single-layer structure, the second connection structure 13 and the first redundant electrode 15 are formed in a same layer and may be prepared by a same process, in a case where the second connection structure 13 is a multi-layer structure, the first redundant electrode 15 and a layer of structure of the second connection structure 13 farthest from the second surface are formed in a same layer and may be prepared by a same process. Similarly, the second redundant electrode 25 is not connected to the third connection structure 22, and in a case where the third connection structure 22 is a single-layer structure, the third connection structure 22 and the second redundant electrode 25 are formed in a same layer and may be prepared by a same process, in a case where the third connection structure 22 is a multi-layer structure, the second redundant electrode 25 and a layer of structure of the third connection structure 22 farthest from the second dielectric substrate 21 are formed in a same layer and may be prepared by a same process. The first redundant electrode 15 and the second redundant electrode 25 each may be a ring-shaped structure or may be a structure formed by a plurality of sub-electrodes disposed at intervals.

Furthermore, a process for bonding may coat copper nanosolder or Cu/Ag nanosolder on contact surfaces of the interposer and the package substrate, and a continuous interface is formed by a high-temperature (less than 400° C.) sintering. A low-temperature bonding process may also be selected, before bonding, copper on the contact surfaces is polished to a roughness of less than 10 nm by the CMP process, and then a Cr/Cu film with a total thickness less than 1000 nm is evaporated, the second connection structure 13 of the interposer and the third connection structure 22 of the package substrate are bonded for 30 minutes at 120° C. and 30 MPa, and mutual diffusion of Cu atoms at the interface enables the bonding between materials to be realized.

It should be noted that, the manner of bonding is selected to realize the connection between the interposer and the package substrate, which is beneficial to realizing a high integration.

In some examples, the method for manufacturing the composite substrate may further include: forming a third insulation layer 18 on a side of the first connection structure 12 away from the first surface, forming a third via at a position of the third insulation layer 18 corresponding to the first connection structure 12, and forming a third transfer electrode 19 in the third via; forming a fourth insulation layer 28 on a side of the fourth connection structure 23 away from the second dielectric substrate 21, forming a fourth via at a position of the fourth insulation layer 28 corresponding to the fourth connection structure 23, and forming a fourth transfer electrode 29 in the fourth via; the third transfer electrode 19 being configured to be electrically connected to the chip to be installed; the fourth transfer electrode 29 being configured to be electrically connected to the printed circuit board to be installed. For example, materials of the third transfer electrode 19 and the fourth transfer electrode 29 may be nickel-gold or nickel-palladium-gold. The third transfer electrode 19 and the chip may be soldered together by using a solder bump or a copper pillar structure. The fourth transfer electrode 29 and the printed circuit board may be soldered together by using a solder bump or a copper pillar structure.

In a third aspect, the present disclosure further provides an electronic device including the composite substrate described above.

It should be understood that the above implementations are merely exemplary implementations adopted to illustrate a principle of the present disclosure, but the present disclosure is not limited thereto. For those skilled in the art, without departing from spirit and essence of the present disclosure, various modifications and improvements may be made, and these modifications and improvements are regarded as within the protection scope of the present disclosure.

What is claimed is:

1. A composite substrate, comprising:

a package substrate and an interposer which are stacked, wherein the interposer comprises:

a first dielectric substrate comprising a first connection via penetrating through the first dielectric substrate along a thickness direction, in which a thickness of the first dielectric substrate extends, of the first dielectric substrate, and a first surface and a second surface opposite to each other along the thickness direction of the first dielectric substrate;

a first connection electrode disposed in the first connection via; and a first connection structure and a second connection structure respectively disposed on the first surface and the second surface and both connected to the first connection electrode;

the package substrate comprises:

a second dielectric substrate disposed on a side of the second connection structure away from the first dielectric substrate;

a third connection structure and a fourth connection structure which are disposed on the second dielectric substrate and are electrically connected, the third connection structure being electrically connected to the first connection electrode through the second connection structure, wherein the second connection structure and the third connection structure are directly contacted with each other, wherein the interposer further comprises a first redundant electrode disposed on the second surface and located in a peripheral region, the package substrate further comprises a second redundant electrode disposed on a side of the second dielectric substrate close to the second connection structure and located in the peripheral region; the first redundant electrode and the second redundant electrode are connected by bonding, the first redundant electrode is not connected to the second connection structure, and the second redundant electrode is not connected to the third connection structure.

2. The composite substrate of claim 1, wherein a third insulation layer is disposed on a side of the first connection structure away from the first surface, a third via is provided at a position of the third insulation layer corresponding to the first connection structure, and a third transfer electrode is disposed in the third via; a fourth insulation layer is disposed on a side of the fourth connection structure away from the second dielectric substrate, a fourth via is provided at a position of the fourth insulation layer corresponding to the fourth connection structure, and a fourth transfer electrode is disposed in the second via; the third transfer electrode is configured to be electrically connected to a chip to be installed; the fourth transfer electrode is configured to be electrically connected to a printed circuit board to be installed.

3. The composite substrate of claim 1, wherein the first connection structure comprises a plurality of first sub-electrodes, in multiple layers, sequentially disposed on the first surface, and a fifth insulation layer is disposed between any adjacent ones of the first sub-electrodes, and the first sub-electrodes adjacent to each other are electrically connected through a fifth via penetrating through the fifth insulation layer between the first sub-electrodes.

4. The composite substrate of claim 1, wherein the second connection structure comprises a plurality of second sub-electrodes, in multiple layers, sequentially disposed on the second surface, a sixth insulation layer is disposed between any adjacent ones of the second sub-electrodes, and the second sub-electrodes adjacent to each other are electrically connected through a sixth via penetrating through the sixth insulation layer between the second sub-electrodes.

5. The composite substrate of claim 1, wherein the second dielectric substrate is provided with a second connection via penetrating through the second dielectric substrate along a thickness direction, in which a thickness of the second dielectric substrate extends, of the second dielectric substrate, and a second connection electrode is disposed in the second connection via; the second dielectric substrate comprises a third surface and a fourth surface opposite to each other along the thickness direction of the second dielectric substrate; and third surface is closer to the second surface than the fourth surface;

the third connection structure is disposed on the third surface, the fourth connection structure is disposed on the fourth surface, and the third connection structure is electrically connected to the fourth connection structure through the second connection electrode.

6. The composite substrate of claim 5, wherein the third connection structure comprises a plurality of third sub-electrodes, in multiple layers, sequentially disposed on the third surface, and a seventh insulation layer is disposed between any adjacent ones of the third sub-electrodes, and the third sub-electrodes adjacent to each other are electrically connected through a seventh via penetrating through the seventh insulation layer between the third sub-electrodes.

7. The composite substrate of claim 5, wherein the fourth connection structure comprises a plurality of fourth sub-electrodes, in multiple layers, sequentially disposed on the fourth surface, and an eighth insulation layer is disposed between any adjacent ones of the fourth sub-electrodes, and the fourth sub-electrodes adjacent to each other are electrically connected through an eighth via penetrating through the eighth insulation layer between the fourth sub-electrodes.

8. The composite substrate of claim 5, wherein materials of the first dielectric substrate and the second dielectric substrate are the same as each other.

9. The composite substrate of claim 1, wherein the third connection structure and the fourth connection are disposed in a same layer, and a ninth insulation layer is disposed between the layer in which the third connection structure and the fourth connection structure are disposed and the second dielectric substrate.

10. The composite substrate of claim 9, wherein the second dielectric substrate comprises a metal substrate or a metal-ceramic composite substrate.

11. The composite substrate of claim 1, wherein the first dielectric substrate comprises a glass substrate.

12. The composite substrate of claim 1, wherein the second dielectric substrate comprises a ceramic substrate.

13. The composite substrate of claim 1, further comprising a chip and a printed circuit board; the chip is electrically connected to the first connection structure; the printed circuit board is electrically connected to the fourth connection structure.

14. A method for manufacturing a composite substrate, comprising: forming a package substrate and an interposer, and electrically connecting the package substrate with the interposer, wherein the forming an interposer comprises:

providing a first dielectric substrate comprising a first connection via penetrating through the first dielectric substrate along a thickness direction, in which a thickness of the first dielectric substrate extends, of the first dielectric substrate, and a first surface and a second surface opposite to each other along the thickness direction of the first dielectric substrate; and forming a first connection electrode in the first connection via, forming a first connection structure on the first surface, and forming a second connection structure on the second surface, the first connection structure being electrically connected to the second connection structure through the first connection electrode;

the forming a package substrate comprises:

providing a second dielectric substrate; and forming a third connection structure and a fourth connection structure on the second dielectric substrate; the third connection structure being configured to be electrically connected to the first connection electrode through the second connection structure, wherein the electrically connecting the package substrate with the interposer comprises:

bonding the first dielectric substrate formed with the second connection structure with the second dielectric substrate formed with the third connection structure, electrically connecting the package substrate and the interposer through a bonded connection between the second connection structure and the third connection structure, wherein a first redundant electrode is further formed in a peripheral region during forming the second connection structure; a second redundant electrode is further formed in the peripheral region during forming the third connection structure, the first redundant electrode and the second redundant electrode are connected by bonding, the first redundant electrode is not connected to the second connection structure, and the second redundant electrode is not connected to the third connection structure.

* * * * *